United States Patent
Zhu et al.

(10) Patent No.: US 12,368,324 B2
(45) Date of Patent: Jul. 22, 2025

(54) INDUCTIVE COUPLING SYSTEM AND METHOD FOR ADAPTIVE CONTROL OF POWER TRANSFER FOR WIRELESS THREE-DIMENSIONAL STACKED CHIP PACKAGE

(71) Applicants: ZHEJIANG UNIVERSITY, Zhejiang (CN); JCET GROUP CO., LTD., Jiangsu (CN)

(72) Inventors: Xiaolei Zhu, Hangzhou (CN); Rushuo Tao, Hangzhou (CN); Chonghui Sun, Hangzhou (CN); Kun Yang, Hangzhou (CN); Cheng Yang, Wuxi (CN)

(73) Assignees: ZHEJIANG UNIVERSITY, Zhejiang (CN); JCET GROUP CO., LTD., Jiangsu (CN)

( * ) Notice: Subject to any disclaimer, the term of this patent is extended or adjusted under 35 U.S.C. 154(b) by 101 days.

(21) Appl. No.: 18/393,684

(22) Filed: Dec. 22, 2023

(65) Prior Publication Data

US 2024/0162751 A1 May 16, 2024

(30) Foreign Application Priority Data

Dec. 22, 2022 (CN) .......................... 202211658023.2

(51) Int. Cl.
*H02J 50/10* (2016.01)
*H01L 25/065* (2023.01)
*H02J 50/80* (2016.01)
*H04B 5/24* (2024.01)

(52) U.S. Cl.
CPC .............. *H02J 50/10* (2016.02); *H02J 50/80* (2016.02); *H04B 5/24* (2024.01); *H01L 25/0657* (2013.01); *H01L 2225/06531* (2013.01)

(58) Field of Classification Search
CPC .. H02J 50/10; H02J 50/80; H04B 5/24; H01L 25/0657; H01L 2225/06531
See application file for complete search history.

(56) References Cited

U.S. PATENT DOCUMENTS

| | | | |
|---|---|---|---|
| 10,218,225 B2 * | 2/2019 | Desrosiers | H02M 3/158 |
| 11,862,986 B1 * | 1/2024 | Walley | H02M 3/158 |
| 2021/0367457 A1 * | 11/2021 | Sherman | H04B 5/79 |

* cited by examiner

*Primary Examiner* — Jeffrey M Shin
(74) *Attorney, Agent, or Firm* — JCIPRNET

(57) ABSTRACT

Disclosed is an inductive coupling system and method for adaptive control of power transfer for a wireless three-dimensional stacked chip package. The system includes a slave chip and a master chip connected via inductive coupling; the system for adaptive control of power transfer herein shifts a load feedback voltage received by the slave chip into a feedback voltage data codeword through a level decision circuit, and the system can load the feedback voltage data codeword onto a data link of the system and feedback same to the master chip. In the present disclosure, the master chip includes a DPID control circuit controls a voltage-controlled oscillator and a frequency divider to adjust the frequency of an input clock in an energy transfer system so as to achieve adaptive control of the transmitting power of a transmitting chip.

8 Claims, 2 Drawing Sheets

INDUCTIVE COUPLING SYSTEM AND METHOD FOR ADAPTIVE CONTROL OF POWER TRANSFER FOR WIRELESS THREE-DIMENSIONAL STACKED CHIP PACKAGE

CROSS-REFERENCE TO RELATED APPLICATION

This application claims the priority benefit of China application serial no. 202211658023.2, filed on Dec. 22, 2022. The entirety of the above-mentioned patent application is hereby incorporated by reference herein and made a part of this specification.

BACKGROUND

1. Technical Field

The present disclosure relates to the technical field of integrated circuits and, more particularly, to a system and method for adaptive control of power transfer in an inductive coupling interconnection transfer system for a three-dimensional stacked chip package.

2. Description of Related Art

In recent years, inter-chip wireless interconnection technology has been greatly developed, extensive studies have been conducted on three-dimensional stacked chip data links based on inductive coupling, while many critical problems are still there regarding inter-chip power transfer. The existing solutions of power transfer applied in the field of three-dimensional stacked chip packaging are mostly open-loop systems, where the missing feedback loop not only reduces the stability of the system and the transfer efficiency of power between chips, but also introduces a voltage-stabilizing resistor at the load end, hence a large amount of energy is wasted in the chip working process. To solve this problem, a feedback control loop can be introduced between chips, so that the receiving voltage can be fed back to the input through the data loop in the form of digital signal, so as to control the working state of the system, reduce the energy dissipation in the process of energy transfer between chips, improve the efficiency of energy transfer, and enhance the stability of the system.

Since analog signals are difficult to be fed back to the transmitting end simply by wireless transfer, most of the wireless inter-chip feedback signals are digital in recent years, that is, the received voltage is fed back to the transmitting end in the form of digital signals after being processed by sampling, encoding, and the like, forming a feedback loop to enhance the stability of the system. In A 13.56 MHz Wireless Power Transfer System With Reconfigurable Resonant Regulating Rectifier and Wireless Power Control for Implantable Medical Devices published in IEEE Journal of Solid-State Circuits (JSSC) in 2015, a reconfigurable output rectifier with resonant regulation is proposed to control the operating state of a rectifier by transmitting a digital signal through a control loop, so as to realize wireless power control. However, the inductor and digital control module design of this proposal is off-chip, not proper as an inductive coupling strategy applied to a three-dimensional stacked chip package, and in a case where the control circuit design is off-chip, the signal transfer delay from on-chip to off-chip will lead to a significant increase in system response time. Moreover, after the control codeword output by the digital control loop is fed back to the transmitting end, pulse control is adopted at the transmitting end, and the control efficiency, accuracy, and load variable range are all limited.

SUMMARY

In view of the above deficiencies of the prior art, there is a need for a system strategy for adaptive control of power transfer in an inductive coupling interconnection transfer system for a three-dimensional stacked chip package with high efficiency, quick response, and low power consumption. Accordingly, the present disclosure provides an inductive coupling system and method for adaptive control of power transfer for a wireless three-dimensional stacked chip package. The technical solution adopted by the present disclosure is to control the transfer power of a system by changing the system clock frequency of an energy transfer link, designing a level decision circuit in a slave chip (receiving end) in the system, shifting the received voltage into a digital signal (a feedback voltage data codeword) after comparing the same with a preset reference voltage, and feedback the same to a master chip (transmitting end) in the system through a reverse transfer digital transfer link, so as to control the transfer power of the system.

The technical solution of the present disclosure is as follows.

In a first aspect, the present disclosure provides a system for adaptive control of power transfer in an inductive coupling interconnection transfer system for a three-dimensional stacked chip package, including two chips connected via inductive coupling, wherein the two chips are a master chip and a slave chip, and the master chip includes an energy transmitting end, a data receiving end, a DPID control circuit, a voltage controlled oscillator and a frequency divider; the slave chip includes an energy receiving end, a data transmitting end, and a level decision circuit; the energy transmitting end and the energy receiving end are connected via inductive coupling to form an energy transfer link, the data receiving end and the data transmitting end are connected via inductive coupling to form a data transfer link; the energy transmitting end includes an energy transmitter and an energy transmitting inductor that are connected to each other; the energy receiving end includes an energy receiver and an energy receiving inductor that are connected to each other; the data transmitting end includes a data transmitter and a data transmitting inductor that are connected to each other, and the data receiving end includes a data receiver and a data receiving inductor that are connected to each other; wherein the level decision circuit includes an array of comparators and an array of level shifters; the array of comparators compares a load feedback voltage with a reference voltage, and then shifts the load feedback voltage into a feedback voltage data codeword by the array of level shifters; the DPID control circuit includes a DPID controller and an error calculating unit, and the error calculating unit can subject the feedback voltage data codeword and the reference voltage data codeword to a subtraction to obtain a voltage error signal; the DPID controller calculates the voltage error signal and a delay signal thereof to obtain an energy control codeword; the voltage controlled oscillator outputs a clock signal with a stable frequency, and a division ratio of the frequency divider is controlled by an energy control codeword to obtain a controllable energy clock frequency.

As a preferred solution of the present disclosure, the load feedback voltage received by the energy receiving end obtains the feedback voltage data codeword through the level decision circuit, and a load feedback voltage data codeword is transferred between the two chips through data inductive coupling.

As a preferred solution of the present disclosure, the level decision circuit is implemented by employing the array of comparators and the array of level shifters, each current through the array of comparators and the array of level shifters is smaller than 4 µA, and the output voltage from the comparators is level-shifted to a standard high level of 1.2 V for digital circuit operation and fed back to the master chip through the data transfer link.

As a preferred solution of the present disclosure, the DPID control circuit calculates the feedback voltage data codeword received by the data receiving end through inductive coupling interconnection into an energy control codeword based on a DPID control algorithm.

As a preferred aspect of the present disclosure, the energy control codeword controls the voltage-controlled oscillator and the frequency divider, and a variable frequency clock obtained by the frequency divider controls the efficiency of energy transfer.

As preferred embodiments of the present disclosure, the energy transmitter, energy receiver, data transmitter, data receiver, level decision circuit, level shifter circuit, voltage controlled oscillator (VCO), frequency divider, DPID control circuit, energy transmitting inductor, energy receiving inductor, data transmitting inductor and data receiving inductor are all designed on a chip, and the slave chip is powered by an energy transfer link between chips.

In a further aspect, the present disclosure provides a method for adaptive control of power transfer of the system above, including:

1) transmitting energy to the slave chip via the energy transmitting inductor by the energy transmitter on the master chip, receiving the energy by the energy receiving inductor and the energy receiver on the slave chip, and obtaining a load feedback voltage signal on the feedback load of the energy receiver;
2) comparing the load feedback voltage with a pre-set reference voltage by the array of comparators of the level decision circuit, shifting the load feedback voltage into the feedback voltage data codeword by the array of level shifters, and transmitting the feedback voltage data codeword to the master chip by the data transmitter and the data transmitting inductor on the slave chip;
3) after receiving the feedback voltage control codeword by the data receiver on the master chip, subjecting the feedback voltage data codeword and the pre-set reference voltage data codeword to a subtraction by the error calculating unit to obtain the voltage error signal, and calculating the voltage error signal and the delay signal thereof by the DPID controller to obtain the energy control codeword;
4) controlling the frequency division ratio of the frequency divider by the energy control codeword, and after obtaining the frequency division ratio by the frequency divider, subjection a clock output by the voltage control oscillator to frequency division to obtain the controllable energy clock frequency; and
5) adjusting the energy transmitted by the energy transmitter by changing the controllable energy clock frequency for achieving control of energy transfer.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Technical details of the system for adaptive control of power transfer and a core DPID controller thereof are indicated with reference to the drawings below.

Figure 1:
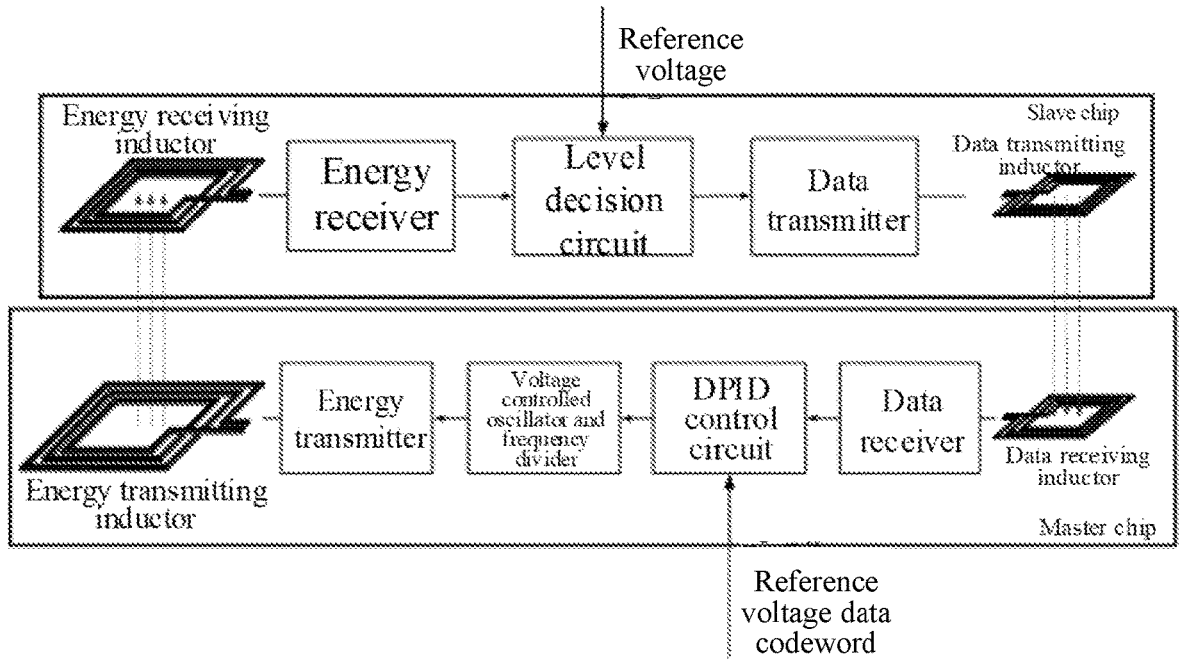
FIG. 1 shows a schematic block diagram of a system for adaptive control of specific power transfer according to the present disclosure.

Referring to FIG. 1, a schematic block diagram of a specific system for adaptive control of power transfer according to the present disclosure is depicted. The wireless system for adaptive control of power transfer of the present disclosure employs inductive coupling interconnection, and the system includes two chips connected via inductive coupling, wherein the two chips are a master chip and a slave chip, and the master chip includes an energy transmitter, an energy transmitting inductor, a data receiver, a data receiving inductor, a DPID control circuit, a voltage controlled oscillator (VCO), and a frequency divider; the slave chip includes an energy receiver, an energy receiving inductor, a data transmitter, a data transmitting inductor and a level decision circuit; the energy transmitter and energy receiver are connected via inductive coupling to form an energy transfer link, and the data receiver and data transmitter are connected via inductive coupling to form a data transfer link, wherein the level decision circuit includes an array of comparators and an array of level shifters; the array of comparators compares a load feedback voltage with a reference voltage, and then shifts the load feedback voltage into a feedback voltage data codeword by the array of level shifters; the DPID control circuit includes a DPID controller and an error calculating unit, and the error calculating unit can subject the feedback voltage data codeword and the reference voltage data codeword to a subtraction to obtain a voltage error signal; the DPID controller calculates the voltage error signal and a delay signal thereof to obtain an energy control codeword; the voltage controlled oscillator outputs a clock signal with a stable frequency, and a division ratio of the frequency divider is controlled by an energy control codeword to obtain a controllable energy clock frequency.

The energy transmitter, the energy receiver, the data transmitter, the data receiver, the level decision circuit, a level shifter circuit, the voltage-controlled oscillator, the frequency divider, the DPID control circuit, the energy transmitting inductor, the energy receiving inductor, the data transmitting inductor, and the data receiving inductor of the system herein are all designed on the chip, and the slave chip is powered by the energy transfer link between chips. A feedback voltage data codeword is obtained via the level decision circuit from the load feedback voltage received by the energy receiver; after the feedback voltage data codeword is transmitted back to the transmitting end via the data transmitter by the data transmitting inductor, the data receiver at the transmitting end receives data through the data receiving inductor and subject the same and the reference voltage data codeword to a subtraction to obtain a voltage error signal. The voltage error signal is input into the DPID control circuit, the energy control codeword obtained by DPID operation is used to control the division ratio of the frequency divider and regulate the rapid change of clock frequency of the energy transfer system, and finally, the adaptive control of system transfer power is realized.

In a preferred embodiment of the present disclosure, the load feedback voltage received by the energy receiving end obtains the feedback voltage data codeword through the level decision circuit, and a load feedback voltage data codeword is transferred between the two chips through data inductive coupling.

The level decision circuit is implemented using an array of comparators and an array of level shifters, each current through the array of comparators and the array of level shifters being less than 4 µA. The load feedback voltage is compared with the reference voltage by the comparator, and if the load feedback voltage is higher than the reference voltage, a high voltage is output; if the load feedback voltage is higher than the reference voltage, a low voltage is output. The high voltage output by the comparator is level-shifted to a standard high level of 1.2V for digital circuit operation (the low voltage output by the comparator, i.e., a zero level, is not shifted) and fed back to the master chip through the data transfer link. The level shift is implemented by a level shift circuit.

The DPID controller includes a delaying module and a DPID multiplier-adder; the delaying module delays the voltage error signal obtained by the error calculating unit to obtain a delayed signal, and the DPID multiplier-adder multiplies and adds the voltage error signal obtained by the error calculating unit and the delayed signal thereof to obtain the energy control codeword.

The energy control codeword controls the voltage-controlled oscillator and the frequency divider, and a variable frequency clock obtained by the frequency divider controls the efficiency of energy transfer.

The main control flow of the system of the present disclosure is summarized here. Once the load of the receiving end changes, resulting in a change of the received voltage, the feedback voltage is compared with a preset reference voltage by the array of comparators to obtain the voltage data codeword; after being transferred to the transmitting end through a data link, the voltage data codeword is subtracted from the reference digital signal to obtain a voltage error signal; the voltage error signal is input to the DPID control circuit; the energy control codeword is obtained through DPID operation to control the VCO and the output frequency of the frequency divider, so as to regulate the rapid change of the clock frequency of the energy transfer system, and finally achieve the adaptive control of the system transfer power.

Based on the above control flow, the present disclosure provides a method for adaptive control of power transfer of the system above, including:

1) transmitting energy to the slave chip via the energy transmitting inductor by the energy transmitter on the master chip, receiving the energy by the energy receiving inductor and the energy receiver on the slave chip, and obtaining a load feedback voltage signal on the feedback load of the energy receiver;

2) comparing the load feedback voltage with a pre-set reference voltage by the array of comparators of the level decision circuit, shifting the load feedback voltage into the feedback voltage data codeword by the array of level shifters, and transmitting the feedback voltage data codeword to the master chip by the data transmitter and the data transmitting inductor on the slave chip;

3) after receiving the feedback voltage control codeword by the data receiver on the master chip, subjecting the feedback voltage data codeword and the pre-set reference voltage data codeword to a subtraction by the error calculating unit to obtain the voltage error signal, and calculating the voltage error signal and the delay signal thereof by the DPID controller to obtain the energy control codeword;

4) controlling the frequency division ratio of the frequency divider by the energy control codeword, and after obtaining the frequency division ratio by the frequency divider, subjection a clock output by the voltage control oscillator to frequency division to obtain the controllable energy clock frequency; and 5) adjusting the energy transmitted by the energy transmitter by changing the controllable energy clock frequency for achieving control of energy transfer.

The DPID control circuit of the present disclosure includes an error calculating unit and a DPID controller, and the PID controller further includes a delaying module and a DPID multiplier-adder.

The PID controller is, namely, a proportional-integral-derivative controller. The principle of PID controller is as follows. The analog PID control signal u(t) is given below:

$$u(t) = K_p \left[ e(t) + \frac{1}{T_i} \int_0^\tau e(t)dt + T_d \frac{de(t)}{dt} \right] \quad (0.2)$$

$$u(t) = K_p e(t) + K_i \int_0^\tau e(t)dt + K_d \frac{de(t)}{dt}$$

In Equations (0.1) and (0.2), $K_p$ is a proportional coefficient, and $T_i$ and $T_d$ are an integral time constant and a differential time constant, respectively; $K_i$ is an integral coefficient, and $K_d$ is a differential coefficient.

The control signal is obtained by multiplying the proportional coefficient $K_p$, the integral coefficient $K_i$ and the differential coefficient $K_d$ by the proportional, integral and differential terms of the error signal e(t): when there is a difference between the output voltage and the reference voltage, the proportional term will proportionally amplify the error signal to generate a control action at the transmitting end, quickly reducing the error between the two voltages, and improving the accuracy and speed of the control. The main function of the PID integral term is to reduce the static error and keep the stable value of the output voltage near the given reference voltage when the system reaches stability. The differential term reflects a change trend of the system error signal, through which the change trend of the error signal can be adjusted to speed up the system response and shorten the system response time.

A digital PID (DPID) controller is usually obtained by an analog PID controller that discretizes. Compared with an analog PID controller, the DPID controller has the advantages as follows:

1) The application thereof is possible with a minimal understanding of digital control theories.

2) In integrated circuits, digital circuits consume less power, occupy less area, respond faster, and control more accurately.

The common methods for the analog PID controller to discretize include an inverse differentiation method, a forward differentiation method, a bilinear transformation method, an invariant impulse response method, an invariant step response method, and a pole-zero correspondence method. The solution herein adopts backward differentiation transformation. By performing backward differentiation on Equation (1.2) above, the following equation can be derived.

$$u[k] = K_p e[k] + \frac{K_p T}{Ti}\sum_{i=0}^{k} e[i] + \frac{K_p T_d}{Ti}[e[k] - e[k-1]] \quad (0.3)$$

Equation (0.3) is a PID position-type control algorithm, where k is a certain moment after the time is discretized, and the same reasoning can be applied to obtain the equation below:

$$u[k-1] = K_p e[k-1] + \frac{K_p T}{Ti}\sum_{i=0}^{k-1} e[i] + \frac{K_p T_d}{Ti}[e[k-1] - e[k-2]] \quad (0.4)$$

Thus, a recursive expression for the PID position-type control algorithm can be expressed as:

$$u[k] = u[k-1] + K_p[e[k] - e[k-1]] + \frac{K_p T}{Ti}e[k] + \frac{K_p T_d}{Ti}[e[k] - 2e[k-1] - e[k-2]] \quad (0.5)$$

The equation below can be derived by further organizing the equation above:

$$u[k]=u[k-1]+K_p[e[k]-e[k-1]]+K_i e[k]+K_d[e[k]-2e[k-1]-e[k-2]] \quad (0.6)$$

In Equation (0.6), the proportional coefficient is $K_p$, the integral coefficient is $K_i$, the differential coefficient is $K_d$, and e[k] is the error semaphore in discrete time. Further elaboration of the above equation gives:

$$u[k]=u[k-1]+K_0 e[k]+K_1 e[k-1]+K_2 e[k-2] \quad (0.7)$$

In Equation (0.7), the coefficients $K_1$, $K_2$ and $K_3$ can be respectively expressed as:

$$\begin{cases} K_0 = K_p + K_d \\ K_1 = -K_p + K_i - 2K_d \\ K_2 = K_d \end{cases} \quad (0.8)$$

In Equation (0.7), an order of the adjustment of the proportional coefficient $K_p$, the integral coefficient $K_i$ and the differential coefficient $K_d$ is the proportional, the integral, and then the differential coefficient, and the proportional coefficient is determined firstly, so that the response time of the system can be shortened and the response speed can be accelerated by increasing the coefficient, thereby realizing the rapid adjustment of the system output. However, a too large $K_p$ results in a large overshoot of the system and reduces the dynamic performance of the system. The integral time is inversely proportional to the integration, increasing the integral term will lead to the accumulation of errors, hence the integration has serious hysteresis, which results in the deterioration of system stability. A too large integral term will increase the step length of each adjustment, resulting in overshoot, which affects the dynamic performance of the system. Insufficient integration slows the system in eliminating static errors. Increasing the differential term leads to faster error change, resulting in output voltage oscillation and lower system stability.

Figure 2:
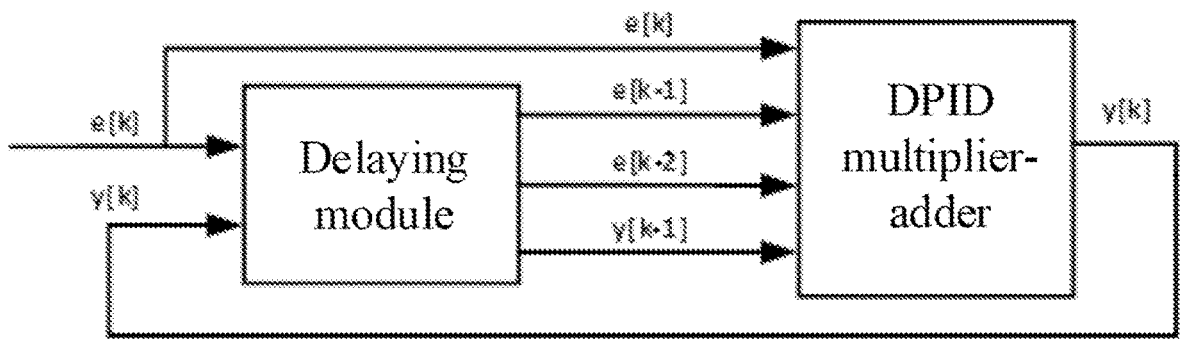
FIG. 2 shows a schematic block diagram of a DPID controller.

Referring to FIG. 2, a signal transition diagram of the DPID controller of the present disclosure is depicted. e[k] is the voltage error signal obtained by subtracting the feedback voltage data codeword from the reference voltage data codeword, and y[k] is the energy control codeword output by the DPID control circuit. After e[k] passes through the delaying module, the delayed signals e[k-1] and e[k-2] are obtained, which retain one and two clock cycles respectively. After y[k] passes through the delaying module, a delayed signal y[k-1] is obtained, which retains one clock cycle. These signals are passed to a DPID multiplier-adder to obtain the final control signal.

The calculation principle of the DPID multiplier-adder is given by Equation (1.9) below:

$$y[k]=y[k-1]+K_0 e[k]+K_1 e[k-1]+K_2 e[k-2] \quad (1.9)$$

In Equation (1.9), the coefficients $K_1$, $K_2$ and $K_3$ can be respectively expressed as:

$$\begin{cases} K_0 = K_p + K_d \\ K_1 = -K_p + K_i - 2K_d \\ K_2 = K_d \end{cases} \quad (1.10)$$

Figure 3:
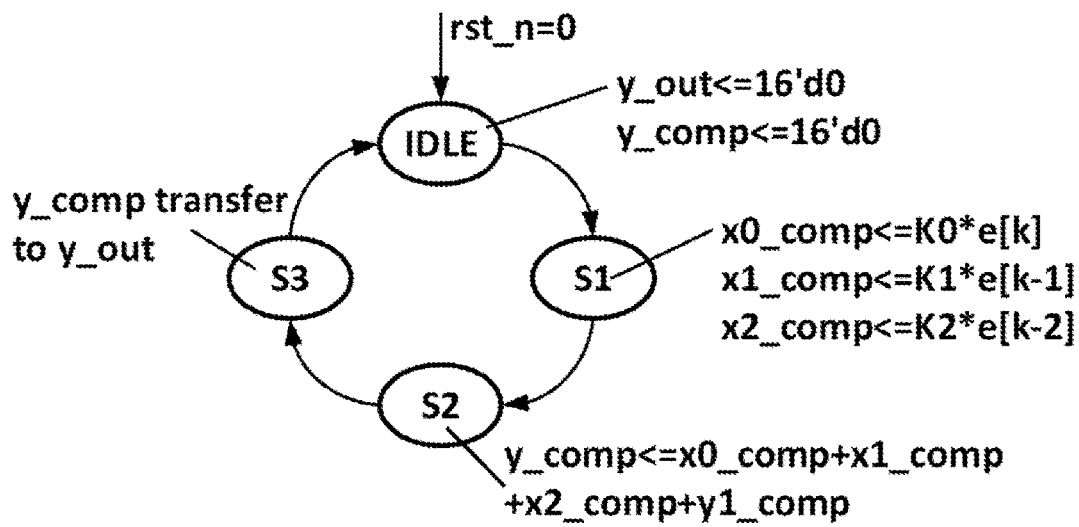
FIG. 3 is a diagram showing state transition of a DPID multiplier-adder.

The proportional coefficient is $K_p$, the integral coefficient is $K_i$, and the differential coefficient is $K_d$, which can adjust the system performance from an external input system. Referring to FIG. 3, a state transition diagram for the DPID multiplier-adder shown in FIG. 2 is described. y_out represents the energy control codeword output by the multiplier-adder, and the DPID state transition principle is as shown in Equation (1.9). When the rst_n signal is set to 0, the DPID multiplier-adder state is IDLE, i.e., both the y_out and y_comp signals are set to zero. When rst_n is active, the multiplier-adder state goes to S1, where the multiplier-adder computes x0_comp<=$K_0$*e[k], x1_comp<=$K_1$*e[k-1], and x2_comp<=$K_1$*e[k-1]; here, the intermediate variables x0_comp, x1_comp, and x2_comp are all in complement form to facilitate subsequent additions. Subsequently, the multiplier-adder state goes to S2 to calculate the complement form y_comp<=x0_comp+x1_comp+x2_comp+y1_comp of the control signal, and finally, the multiplier-adder goes to S3 to shift y_comp to y_out to obtain the original form of the control signal in this state.

Figure 4:
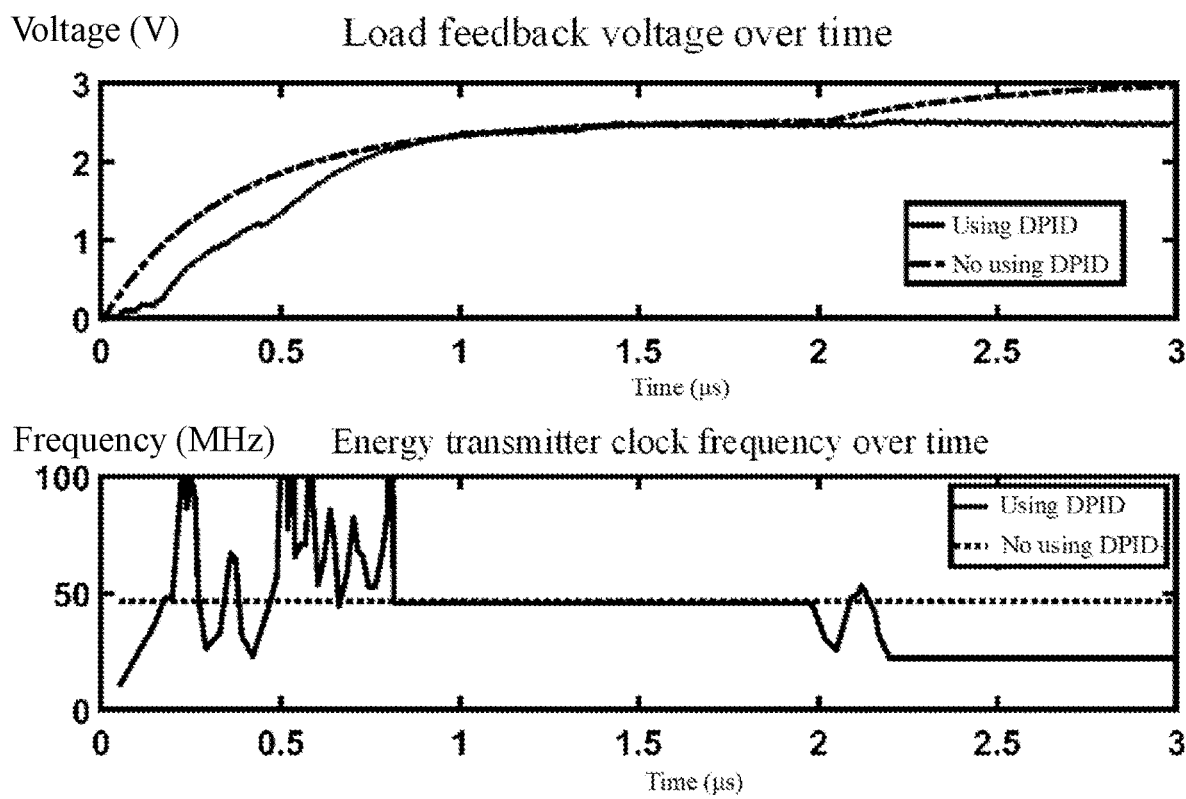
FIG. 4 is a diagram showing a simulation effect of the system for adaptive control of power transfer according to the present disclosure.

With reference to FIG. 4, curves of the load feedback voltage on the system slave chip and the corresponding energy transmitter clock frequency under the control of the DPID control circuit are compared when the load of the energy transfer system changes at the position of 2 μs, using and not using the DPID control circuit. When the load changes, the energy transfer system using the DPID control circuit can stabilize the load end receiving voltage on the slave chip at 2.5V by adjusting the clock frequency of the energy transmitter, and the response time is about 1.5 μs.

Compared with the prior art, the advantageous effect of the present disclosure is that the control modules in the prior art designed outside the three-dimensional stacked chips are all integrated inside the chips. The solution herein overcomes the dependence in the prior art on an external circuit of a chip by designing and integrating a control system which can adaptively adjust the clock frequency of the system on a chip, so that the chip system can realize the adaptive adjustment of power transfer between chips with high integration, low power consumption, high efficiency and low delay without relying on an external circuit.

What is claimed is:

1. A system for adaptive control of power transfer in an inductive coupling interconnection transfer system for a three-dimensional stacked chip package, comprising two chips connected via inductive coupling, wherein the two chips are a master chip and a slave chip, and the master chip comprises an energy transmitting end, a data receiving end, a DPID control circuit, a voltage controlled oscillator and a frequency divider; the slave chip comprises an energy receiving end, a data transmitting end, and a level decision circuit; the energy transmitting end and the energy receiving end are connected via inductive coupling to form an energy transfer link, the data receiving end and the data transmitting end are connected via inductive coupling to form a data transfer link; the energy transmitting end comprises an energy transmitter and an energy transmitting inductor that are connected to each other; the energy receiving end comprises an energy receiver and an energy receiving inductor that are connected to each other; the data transmitting end comprises a data transmitter and a data transmitting inductor that are connected to each other, and the data receiving end comprises a data receiver and a data receiving inductor that are connected to each other;
wherein the level decision circuit comprises an array of comparators and an array of level shifters; the array of comparators compares a load feedback voltage with a reference voltage to obtain a codeword of an output voltage from the array of comparators, and then the array of level shifters shifts the codeword of an output voltage from the array of comparators into a feedback voltage data codeword that can be sent to the data receiving end via the data transmitter; the DPID control circuit comprises a DPID controller and an error calculating unit, and the error calculating unit can subject the feedback voltage data codeword and the reference voltage data codeword to a subtraction to obtain a voltage error signal; the DPID controller calculates the voltage error signal and a delay signal thereof to obtain an energy control codeword; the voltage controlled oscillator outputs a clock signal with a stable frequency, and a division ratio of the frequency divider is controlled by an energy control codeword to obtain a controllable energy clock frequency.

2. The system for adaptive control of power transfer according to claim 1, wherein the load feedback voltage received by the energy receiving end obtains the feedback voltage data codeword through the level decision circuit, and a load feedback voltage data codeword is transferred between the two chips through data inductive coupling.

3. The system for adaptive control of power transfer according to claim 1, wherein the level decision circuit is implemented by employing the array of comparators and the array of level shifters, each current through the array of comparators and the array of level shifters is smaller than 4 μA, and the output voltage from the comparators is level-shifted to a standard high level of 1.2 V for digital circuit operation and fed back to the master chip through the data transfer link.

4. The system for adaptive control of power transfer according to claim 1, wherein the DPID controller comprises a delaying module and a DPID multiplier-adder; the delaying module delays the voltage error signal obtained by the error calculating unit to obtain a delayed signal, and the DPID multiplier-adder multiplies and adds the voltage error signal obtained by the error calculating unit and the delayed signal thereof to obtain the energy control codeword.

5. The system for adaptive control of power transfer according to claim 1, wherein the energy control codeword controls the voltage-controlled oscillator and the frequency divider, and a variable frequency clock obtained by the frequency divider controls the efficiency of energy transfer.

6. The system for adaptive control of power transfer according to claim 1, wherein the energy transmitter, the energy receiver, the data transmitter, the data receiver, the level decision circuit, a level shifter circuit, the voltage-controlled oscillator, the frequency divider, the DPID control circuit, the energy transmitting inductor, the energy receiving inductor, the data transmitting inductor, and the data receiving inductor are all designed on the chip, and the slave chip is powered by the energy transfer link between chips.

7. A method for adaptive control of power transfer of the system according to claim 1, comprising:
1) transmitting energy to the slave chip via the energy transmitting inductor by the energy transmitter on the master chip, receiving the energy by the energy receiving inductor and the energy receiver on the slave chip, and obtaining a load feedback voltage signal on the feedback load of the energy receiver;
2) comparing the load feedback voltage with a pre-set reference voltage by the array of comparators of the level decision circuit, shifting the load feedback voltage into the feedback voltage data codeword by the array of level shifters, and transmitting the feedback voltage data codeword to the master chip by the data transmitter and the data transmitting inductor on the slave chip;
3) after receiving the feedback voltage control codeword by the data receiver on the master chip, subjecting the feedback voltage data codeword and the pre-set reference voltage data codeword to a subtraction by the error calculating unit to obtain the voltage error signal, and calculating the voltage error signal and the delay signal thereof by the DPID controller to obtain the energy control codeword;
4) controlling the frequency division ratio of the frequency divider by the energy control codeword, and after obtaining the frequency division ratio by the frequency divider, subjection a clock output by the voltage control oscillator to frequency division to obtain the controllable energy clock frequency; and
5) adjusting the energy transmitted by the energy transmitter by changing the controllable energy clock frequency for achieving control of energy transfer.

8. The method according to claim 7, wherein, in step 3), a process of said calculating the voltage error signal and the delay signal thereof by the DPID controller to obtain the energy control codeword is as fellow:
e[k] is a voltage error signal obtained by subjecting the feedback voltage data codeword and the reference voltage data codeword to a subtraction, and y[k] is the energy control codeword output by the DPID control circuit; firstly, e[k] passes through the delaying module to obtain delayed signals e[k−1] and e[k−2], respectively, retaining one and two clock cycles; y[k] passes through the delaying module to obtain a delayed signal y[k−1] retaining one clock cycle; inputting these signals into the DPID multiplier-adder to obtain a final energy control codeword;

$$y[k]=y[k-1]+K_0 e[k]+K_1 e[k-1]+K_2 e[k-2]$$

where coefficients $K_1$, $K_2$ and $K_3$ can be presented as:

$$\begin{cases} K_0 = K_p + K_d \\ K_1 = -K_p + K_i - 2K_d \\ K_2 = K_d \end{cases}$$

$K_p$ is a proportional coefficient, $K_i$ is an integral coefficient, and $K_d$ is a differential coefficient.

\* \* \* \* \*